United States Patent
Loechelt (12) 
(10) Patent No.: US 10,164,091 B1
(45) Date of Patent: Dec. 25, 2018

(54) ELECTRONIC DEVICE INCLUDING A RING SUPPRESSION STRUCTURE

(71) Applicant: SEMICONDUCTOR COMPONENTS INDUSTRIES, LLC, Phoenix, AZ (US)

(72) Inventor: Gary Horst Loechelt, Tempe, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 13 days.

(21) Appl. No.: 15/666,814

(22) Filed: Aug. 2, 2017

(51) Int. Cl.
   - H01L 29/78 (2006.01)
   - H01L 27/06 (2006.01)
   - H01L 23/528 (2006.01)
   - H01L 29/06 (2006.01)

(52) U.S. Cl.
   CPC ...... *H01L 29/7815* (2013.01); *H01L 23/5286* (2013.01); *H01L 27/0635* (2013.01); *H01L 29/0634* (2013.01); *H01L 29/7805* (2013.01)

(58) Field of Classification Search
   CPC ............ H01L 29/7815; H01L 29/7805; H01L 29/0634; H01L 27/0635; H01L 23/5286
   See application file for complete search history.

(56) References Cited

U.S. PATENT DOCUMENTS

| | | | | |
|---|---|---|---|---|
| 7,482,645 | B2 * | 1/2009 | Wu | H01L 21/743 257/288 |
| 7,521,773 | B2 * | 4/2009 | Yilmaz | H01L 29/7813 257/551 |
| 7,638,841 | B2 * | 12/2009 | Challa | H01L 21/3065 257/341 |
| 8,148,788 | B2 * | 4/2012 | Suzuki | H01L 21/76229 257/409 |
| 8,916,931 | B2 * | 12/2014 | Takeda | H01L 29/0873 257/335 |
| 9,620,585 | B1 | 4/2017 | Loechelt et al. | |
| 2011/0198725 | A1 | 8/2011 | Roest et al. | |
| 2012/0273871 | A1 | 11/2012 | Yedinak et al. | |
| 2015/0206983 | A1 | 7/2015 | Felsl et al. | |

\* cited by examiner

*Primary Examiner* — Syed Gheyas
(74) *Attorney, Agent, or Firm* — Abel Law Group, LLP (57) ABSTRACT

A circuit can include a field-effect transistor having a body, a drain, a gate, and a source. In an embodiment, the circuit can further include a bipolar transistor having a base and a collector, wherein the collector of the bipolar transistor is coupled to the body of the field-effect transistor; and the drain of the field-effect transistor is coupled to the base of the bipolar transistor. In another embodiment, the circuit can include a diode having an anode and a cathode, wherein the source of the field-effect transistor is coupled to the anode of the diode, and the gate of the field effect transistor is coupled to the cathode of the diode. In another aspect, an electronic device can include one or more physical structures that correspond to components within the circuits.

19 Claims, 11 Drawing Sheets

ELECTRONIC DEVICE INCLUDING A RING SUPPRESSION STRUCTURE

FIELD OF THE DISCLOSURE

The present disclosure relates to circuits and electronic devices, and in particular, to circuits including field-effect transistors and bipolar transistors, and to an electronic devices that include a ring suppression structure.

RELATED ART

Ringing is a problem in power conversion circuits. Switching of large currents reacts with parasitic inductance in the circuit to create potentially large voltage overshoots. Ringing may occur during reverse recovery of a metal-oxide-semiconductor field-effect transistor body diode or in hard switching circuit topologies. Further improvements to address ringing issues are desired.

BRIEF DESCRIPTION OF THE DRAWINGS

Embodiments are illustrated by way of example and are not limited in the accompanying figures.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other teachings can certainly be utilized in this application.

In the following description, the terms "intrinsic", "lightly-doped", "moderately-doped", and "heavily-doped", and "degenerate" are employed to indicate relative degrees of doping. These terms are not intended to indicate definitive numerical ranges, but rather to indicate relative dopant concentration levels. Approximate ranges whose upper and lower extremes may be allowed to vary by a factor of 4 in either direction. For example, with silicon, the term "intrinsic" can indicate a dopant concentration of $10^{14}$ atoms/cm$^3$ or less, "lightly-doped" can indicate a concentration in the range between $10^{14}$ and $10^{16}$ atoms/cm$^3$, "moderately-doped" can indicate a concentration in the range of $10^{16}$ to $10^{18}$ atoms/cm$^3$, inclusive, and "heavily-doped" can indicate a concentration in the range of $10^{18}$ to $10^{20}$ atoms/cm$^3$. "Degenerate" indicates a doping level sufficient to provide an ohmic (non-rectifying) connection with a metal contact (generally greater than $10^{20}$ atoms/cm$^3$). Note that for semiconductors other than silicon, these ranges may vary.

The terms "comprises," "comprising," "includes," "including," "has," "having," or any other variation thereof, are intended to cover a non-exclusive inclusion. For example, a method, article, or apparatus that comprises a list of features is not necessarily limited only to those features but may include other features not expressly listed or inherent to such method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read such that the plurals include one or at least one and the singular also includes the plural, unless it is clear that it is meant otherwise. For example, when a single item is described herein, more than one item may be used in place of a single item. Similarly, where more than one item is described herein, a single item may be substituted for that more than one item.

The use of the word "about", "approximately", or "substantially" is intended to mean that a value of a parameter is close to a stated value or position. However, minor differences may prevent the values or positions from being exactly as stated. Thus, differences of up to ten percent (10%) for the value are reasonable differences from the ideal goal of exactly as described.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the semiconductor and electronic arts.

A circuit and an electronic device can be configured to reduce the effects of ringing when a transistor switches between on and off states. Power transistors allow relatively high current to pass when on and can have significant ringing when the transistor is switched from the on state to the off state. A ring suppression structure may be incorporated into a circuit and an electronic device to help control energy dissipation and reduce the amount of voltage overshoot and undershoot and to reduce the time needed to be with 5% of the targeted voltage. In a particular embodiment, a bipolar transistor and a junction field-effect transistor can be serially connected and controlled by the drain voltage of the power transistor.

In an aspect, a circuit can include a field-effect transistor having a body, a drain, a gate, and a source. In an embodiment, the circuit can further include a bipolar transistor having a base and a collector, wherein the collector of the bipolar transistor is coupled to the body of the field-effect transistor; and the drain of the field-effect transistor is coupled to the base of the bipolar transistor. In another embodiment, the circuit can include a diode having an anode and a cathode, wherein the source of the field-effect transistor is coupled to the anode of the diode, and the gate of the field effect transistor is coupled to the cathode of the diode.

In another aspect, an electronic device can include a substrate including a semiconductor material, a first trench, and a second trench spaced apart from the first trench, and a ring suppression structure disposed between the first and second trenches. The ring suppression structure can include a first doped region overlying the substrate and having a first conductivity type; a second doped region overlying the first doped region and having a second conductivity type opposite that of the first conductivity type; and a third doped region overlying the second doped region and having the first conductivity type.

In a further aspect, an electronic device can include a first structure and a second structure. The first structure can include a first doped region having a first conductivity type; a second doped region overlying the first doped region and having a second conductivity type opposite the first conductivity type; and a third doped region overlying the second doped region and having the first conductivity type. The second structure can include a fourth doped region having the first conductivity type and coupled to the first doped region of the first structure.

The circuits and electronic devices will be understood after reading the specification in light of the figures. After reading this specification, skilled artisans will appreciate that embodiments described herein are exemplary and do not limit the scope of the present invention, as defined in the appended claims.

Figure 1:
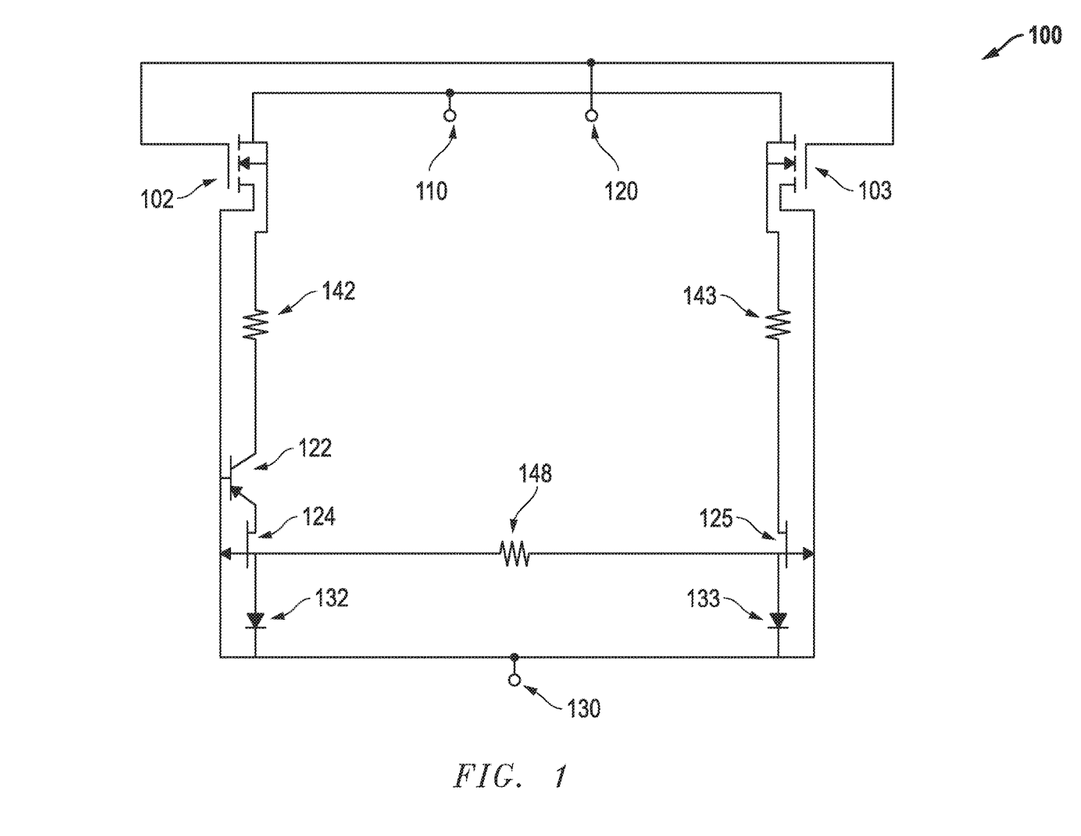
FIG. 1 includes a schematic diagram of a circuit that can be used for ring suppression in accordance with an embodiment.

FIG. 1 includes an exemplary circuit to aid in ring suppression for a power transistor. In an embodiment, the power transistor is an insulated gate field-effect transistor (IGFET). As will be described later in this specification, the left-hand side of FIG. 1 includes a ring suppression portion of the circuit, and the right-hand side of the FIG. 1 includes a contact portion of the circuit and provides proper biasing of a buried region within the trench. For purposes of this specification, the left-hand side of FIG. 1 is referred to as the suppression side, and the right-hand side of FIG. 1 is referred to as the contact side. A bipolar transistor is the only component difference between suppression-side and contact-side portions of the circuit.

Referring to the circuit, a source terminal 110 is coupled to sources and bodies of the power transistors 102 and 103, a collector of a bipolar transistor 122, and a drain of a contact-side junction field-effect (JFET) 125. A gate terminal 120 is coupled to the gates of the power transistors 102 and 103. An emitter of the bipolar transistor 122 is coupled to a drain of a suppression-side JFET 124. A drain terminal 130 is coupled to drains of the power transistors 102 and 103, a base of the bipolar transistor 122, gates of the suppression-side and contact-side JFETs, 124 and 125, and electrodes of charge storage elements. The other electrodes of the charge storage elements are coupled to sources of the suppression-side and contact-side JFETs. In an embodiment, the power transistors 102 and 103 are n-channel IGFETs, the bipolar transistor 122 is a PNP bipolar transistor, the JFETs 124 and 125 are p-channel JFETs, and the charge storage elements are pn junction diodes 132 and 133.

In a particular embodiment, a resistor 142 is coupled between the collector of the bipolar transistor 122 and the source terminal, a resistor 143 is coupled between the drain of the contact-side JFET 125 and the source terminal, and a resistor 148 is coupled between the sources of the suppression-side and contact-side JFETs 124 and 125.

In a particular embodiment, many of the previously-described couplings can be in the form of electrical connections at nodes. In a more particular embodiment, the drain terminal 130, the drains of the power transistors 102 and 103, the base of the bipolar transistor 122, the gates of the suppression-side and contact-side JFETs 124 and 125, and cathodes of the pn junction diodes 132 and 133 are electrically connected to each other at a node. The gate terminal 120 is electrically connected to the gates of the power transistors 102 and 103 at another node. The source terminal 110, the sources of the power transistors 102 and 103, and terminals of resistors 142 and 143 are electrically connected to each other at a further node. The other terminal of the resistor 142 is electrically connected to the collector of the bipolar transistor 122 at still another node; the emitter of the bipolar transistor 122 is electrically connected to the drain of the suppression-side JFET 124 at yet another node; and the source of the suppression-side JFET 124, the anode of the suppression-side pn junction diode 132, and a terminal of the resistor 148 are electrically connected to one another at a further node. The other terminal of resistor 148 is electrically connected to the source of the contact-side JFET 125 and the anode of the contact-side pn junction diode 133; and the drain of the contact-side JFET 125, and the other terminal of resistor 143 are electrically connected to one another at another node.

In the previously described circuit, not all of the components are required. For example, a different type of contact structure may be made to a semiconductor feature that includes the current-carrying portion of the suppression-side JFET 124 and emitter of the bipolar transistor 122. In such an embodiment, the contact-side JFET 125, the contact-side pn junction diode 133, resistors 143 and 148, or any combination thereof may not be present. In another example, the suppression-side JFET 124 or the contact-side JFET 125 may be replaced by resistors.

Figure 2:
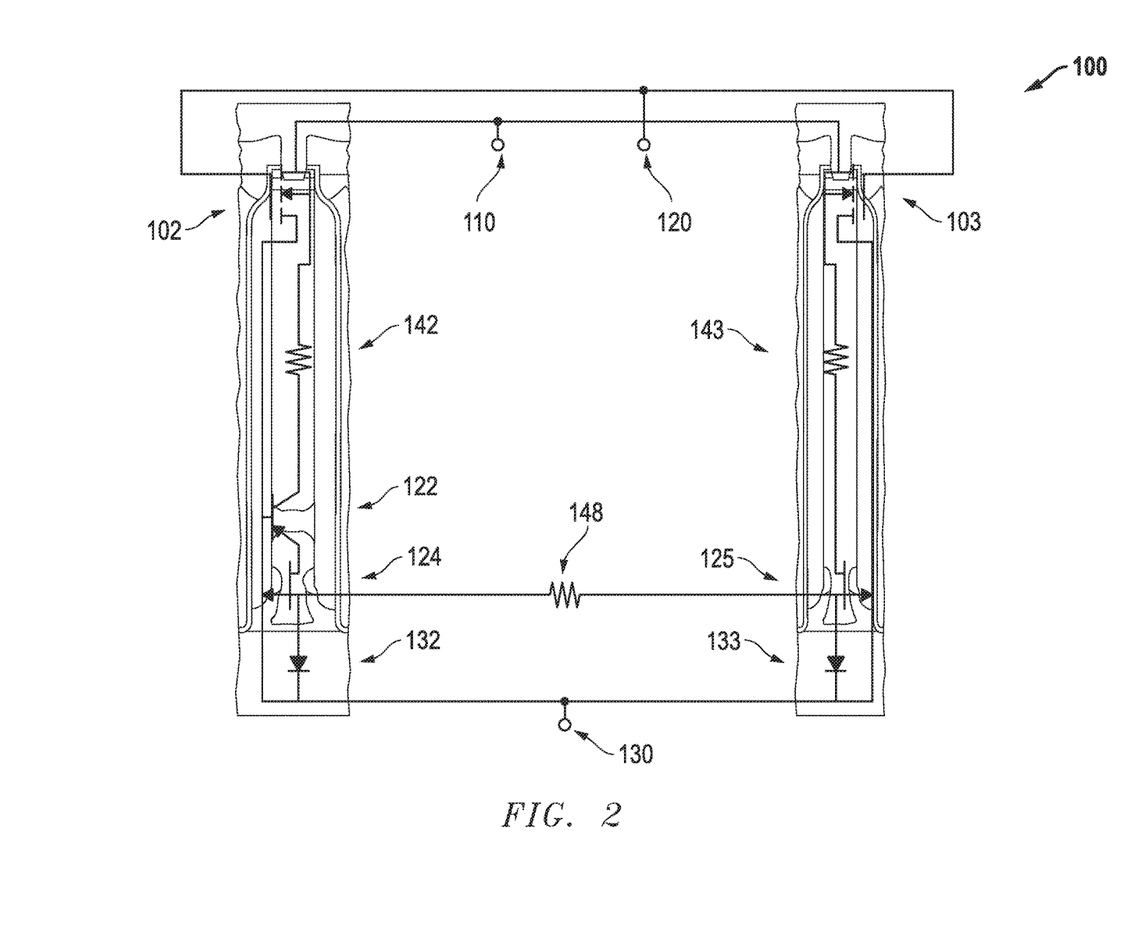
FIG. 2 includes illustrations of portions of physical structures with the circuit of FIG. 1 overlaid onto the portions of the physical structures.

FIG. 2 includes the circuit of FIG. 1 overlaid onto an exemplary physical structure, so that components in the circuit diagram are correlated to portions of the physical structure. All of the portions of the workpiece illustrated in FIG. 1 can be formed within the same trench or different trenches. Thus, the illustrations of the structures in FIG. 2 can be at different portions within the same trench or be within different trenches. Additional power transistor structures can be formed in other trenches. Source regions of the power transistor structures can be connected to each other, gate electrodes of the power transistor structures can be connected to each other, and drain regions of the power transistor structures can be connected to each other. The correlation between the circuit and physical structure will become more apparent with the process description in forming the physical structure.

A process of forming an electronic device that includes the circuit is described below. After reading this specification in its entirety, skilled artisans will appreciate that other processes and electronic devices can be formed that include at least portions of the previously-described circuit. In the description of the process, some operations are well known are at not described; however, after reading this specification, skilled artisans will understand such operations can be performed when desired or needed. For example, before forming a doped region within a layer, a screen oxide layer may be formed to reduce the effects of implant channeling, particularly when boron ions are used are the species during implant. The screen oxide layer may or may not be removed. Further, an anneal may be formed after a doping with one or a plurality of dopants. Thus, the anneal may be performed as the next operation or may be deferred until later in the process flow. Still further, an oxide layer may be grown and removed at one or more particular points in the process to smooth an exposed surface of a semiconductor material.

Figure 3:
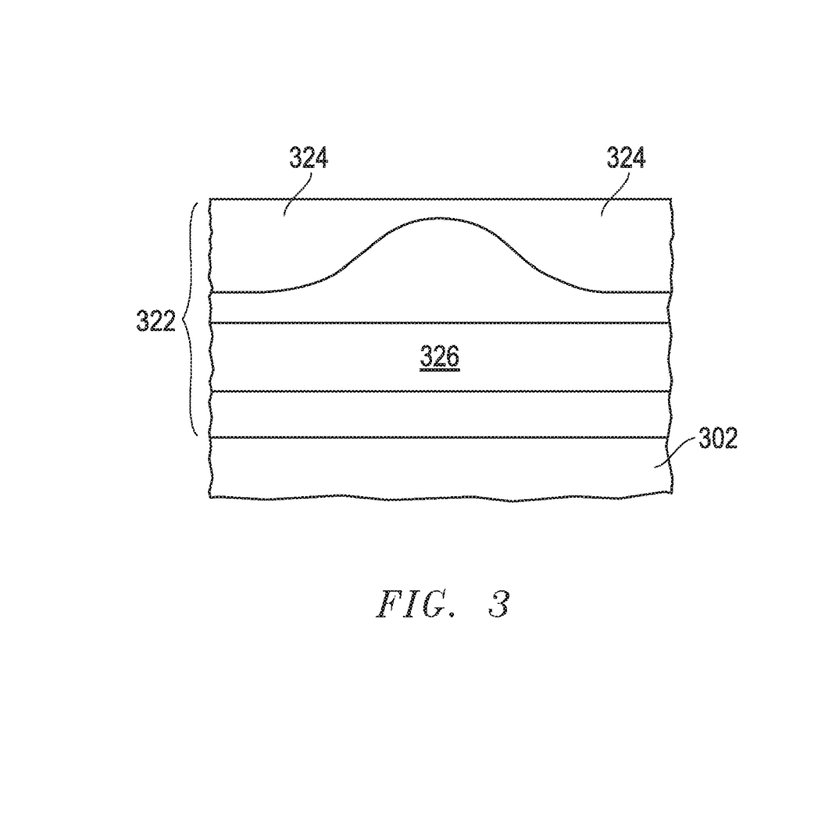
FIGS. 3 and 4 include illustrations of cross-sectional and top views of a portion of a workpiece including a substrate, a semiconductor layer, and doped regions.

FIG. 3 includes an illustration of a workpiece 300 having a partially formed electronic device. The workpiece 300 comprises a semiconductor substrate 302, a semiconductor layer 322, doped regions 324, and a doped region 326 that is buried within the semiconductor layer 322. The substrate 302 can be a heavily doped semiconductor material, such as n-type silicon, and has a resistivity in a range of 1 milliohm-cm to 3 milliohm-cm.

The semiconductor layer 322 is deposited over the substrate 302. In an embodiment, the semiconductor layer 322 is an epitaxially grown silicon layer. In a particular embodiment, the semiconductor layer 322 has a thickness that is in a range of 1.5 microns to 5 microns and has an n-type dopant, such as phosphorus, at a concentration of at most $1\times10^{16}$ atoms/cm$^3$.

The doped regions 324 will be parts of a drain region for the power transistor and gates of the JFETs and will subsequently be connected with the substrate 302. Thus, the substrate 302 and the doped regions 324 have the same conductivity type. The doped region 324 can be selectively formed along the upper surface of the semiconductor layer 322. In an embodiment, the doped region 324 can be formed by implanting arsenic ions (As$^+$). The doped region 324 has peak dopant concentrations in a range of $1\times10^{18}$ atoms/cm$^3$ to $1\times10^{20}$ atoms/cm$^3$ at a depth of 0.1 micron to 0.5 microns below the surface of the semiconductor layer 322.

The doped region 326 will be parts of the anodes of the pn junction diodes and source regions of the JFETs. The doped region 326 has a conductivity type opposite that of the substrate 302 and the doped regions 324. The doped region 326 is formed such that the peak dopant concentration is approximately half way between the substrate 302 and the location of the peak concentration of the doped region 324. The doped region 326 can be formed with boron ions (e.g., B$^+$ or B$^{3+}$). The doped region 326 has a peak dopant concentration in a range of $5\times10^{16}$ atoms/cm$^3$ to $1\times10^{18}$ atoms/cm$^3$.

Figure 4:
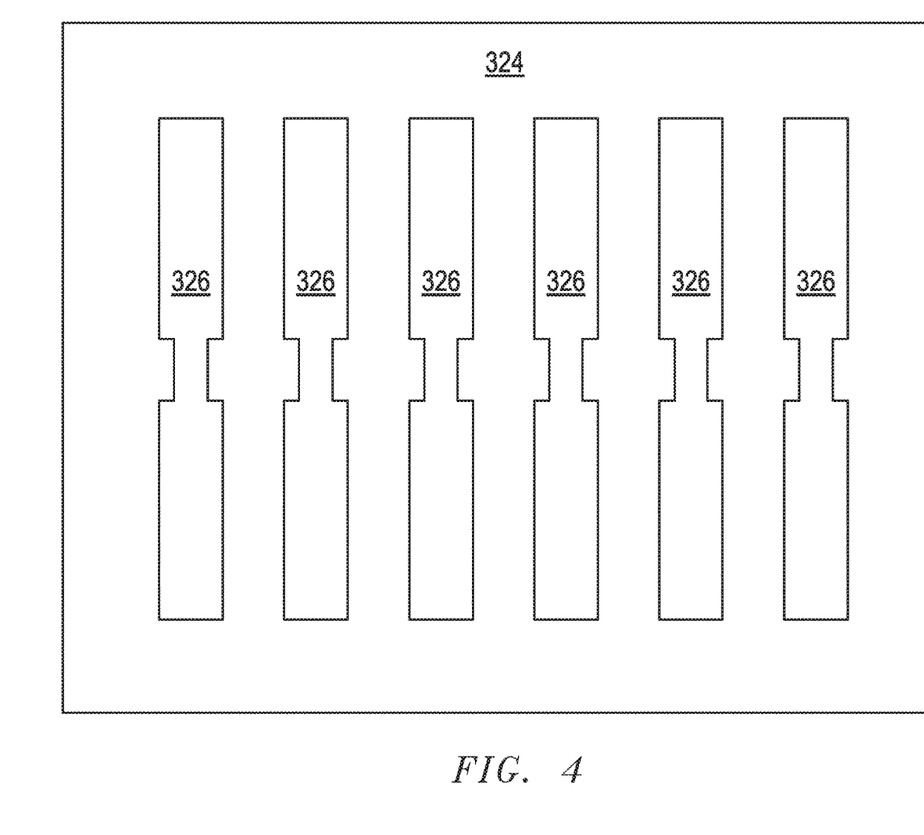

FIG. 4 includes a top view of the workpiece at this point in the process flow. The doped region 324 covers most of the workpiece. Other portions correspond to areas where the doped region 326 is not covered by the doped region 324. Such uncovered portions correspond to locations where base regions (wider areas) of the bipolar transistor structures and the contact-side structures (narrower areas) will be formed.

Figure 5:
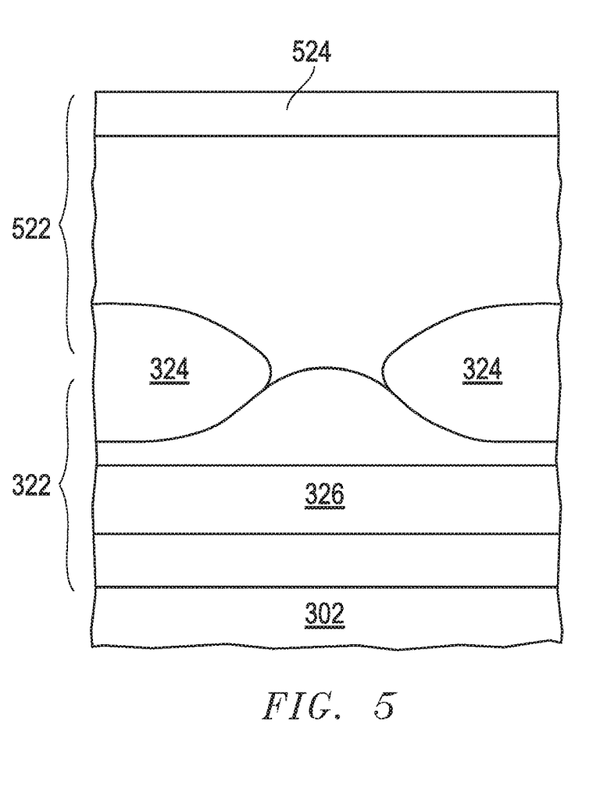
FIGS. 5 and 6 include illustrations of cross-sectional and top views of the workpiece of FIGS. 3 and 4 after forming another semiconductor layer and doped regions.

FIG. 5 includes a cross-sectional view after forming a semiconductor layer 522 and doped regions 524 that will include base regions for the transistor structures. The semiconductor layer 522 is deposited over the doped region 324 and the semiconductor layer 322. In an embodiment, the semiconductor layer 522 is an epitaxially grown silicon layer. In a particular embodiment, the semiconductor layer 522 has a thickness is in a range of 1.5 microns to 5 microns and has an n-type dopant, such as phosphorus, at a concentration of at most $1\times10^{16}$ atoms/cm$^3$.

Figure 6:
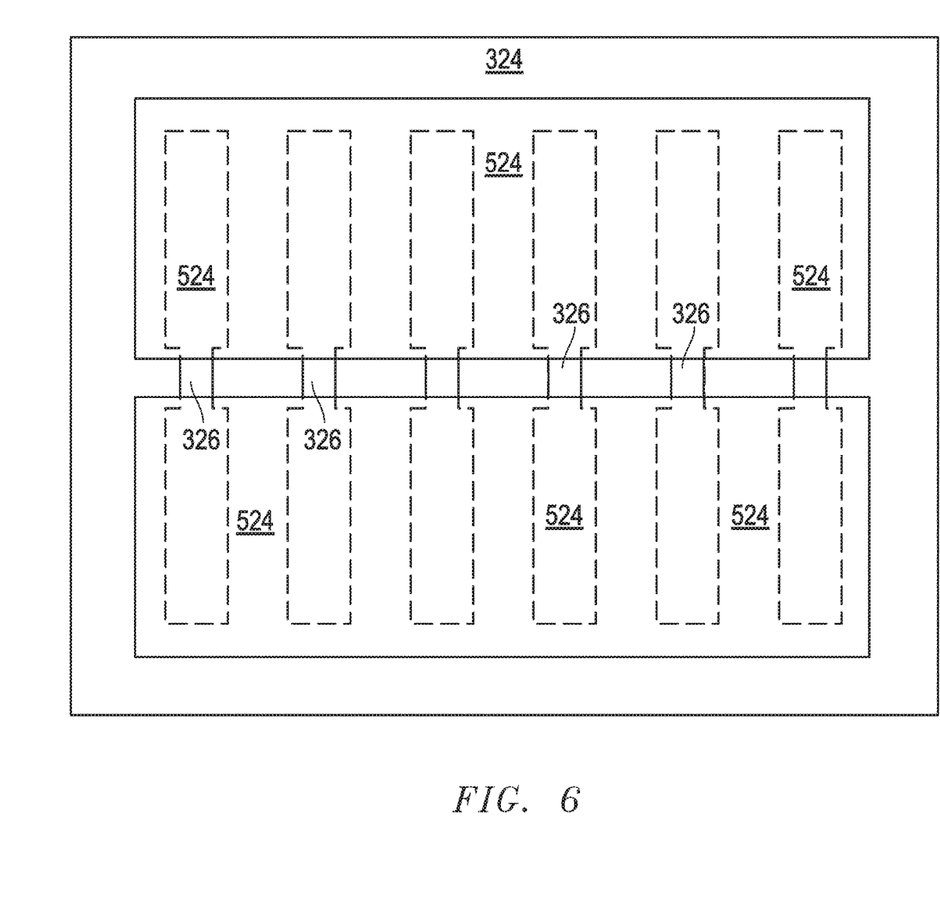

Before forming the doped regions 524, a mask is formed over the workpiece, as illustrated in FIG. 6, such that a masking member covers locations where the doped regions 524 will not be formed. A portion of the masking member covers the contact-side structures as previously described with respect to FIG. 4. The doped regions 524 have a conductivity type that is the same as the substrate 302 and doped region 324 and opposite the doped region 326. The uncovered areas are implanted with ions of an n-type dopant, such as arsenic ions (As$^+$). In a particular embodiment, the doped regions 524 have a peak depth in a range of 0.05 micron to 0.5 micron and in a range of $1\times10^{17}$ atoms/cm$^3$ to $5\times10^{18}$ atoms/cm$^3$. The mask is removed after forming the doped regions 524.

A relatively thick semiconductor layer can be epitaxially grown over the doped regions 524 and other portions of the semiconductor layer 522. The thickness may depend on the normal operating voltage of the transistor structures, with a relatively thicker semiconductor layer being used for relatively higher normal operating voltages and a relatively thinner semiconductor layer being used for relatively lower normal operating voltages. The semiconductor layer may be doped with an n-type dopant, a p-type dopant, or be undoped. If the semiconductor layer is doped, the dopant concentration will be at most $1\times10^{16}$ atoms/cm$^3$.

Figure 7:
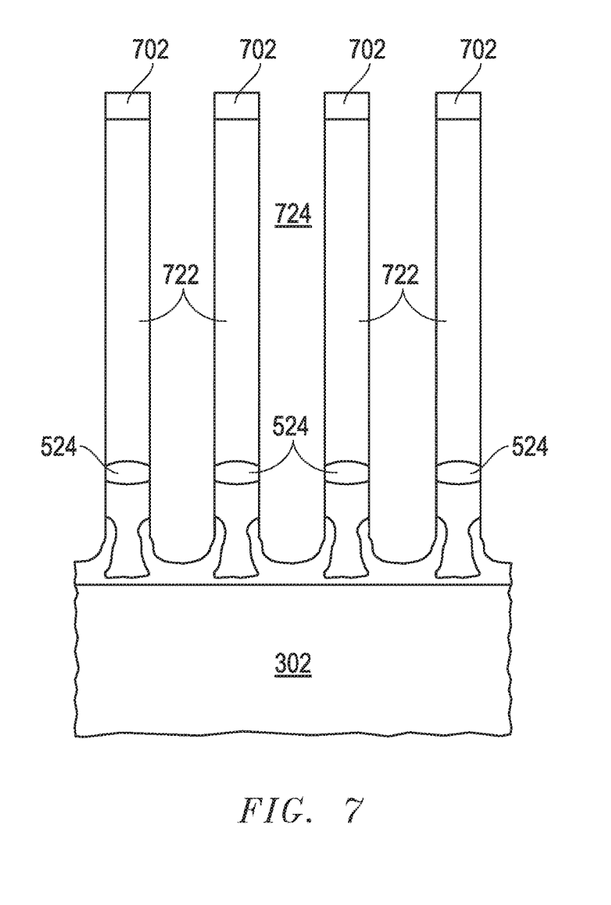
FIGS. 7 and 8 include illustrations of cross-sectional views of the workpiece of FIGS. 5 and 6 after forming pillars and trenches.
Figure 8:
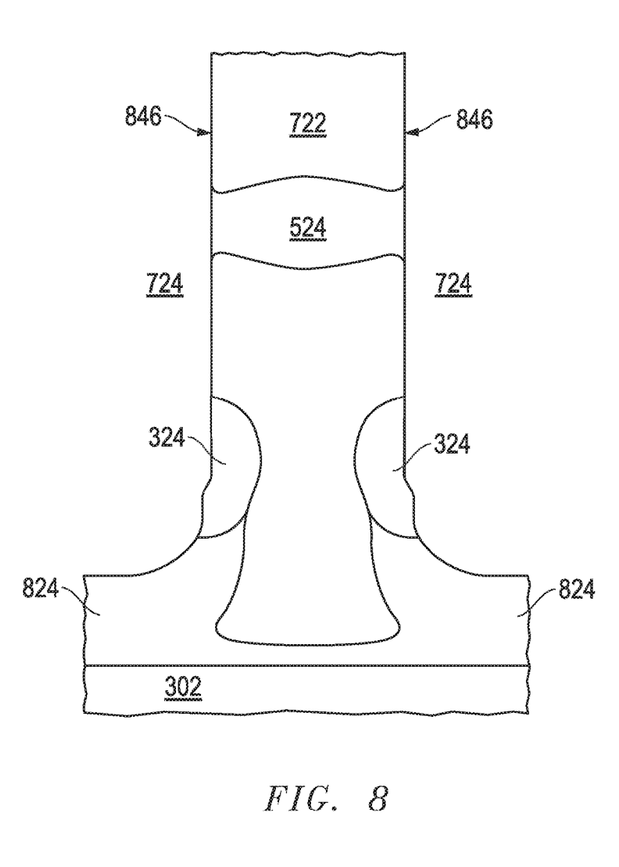

A hard mask layer 702 is formed over the semiconductor layer, and the semiconductor layer is patterned to form pillars 722 and define trenches 724 between the pillars 722, as illustrated in FIGS. 7 and 8. FIG. 7 includes the lengths (vertical direction) of the pillars 722 and the entire depths of the trenches 724, and FIG. 8 include an enlarged portion near the bottoms of one of the pillars 722 and trenches 724. The trenches 724 extend through the relatively thick semiconductor layer, the doped regions 524, the semiconductor layer 522, the doped regions 324, and part of the semiconductor layer 322 (not labeled in FIGS. 7 and 8). In the embodiment illustrated, a remaining portion of the semiconductor layer 322 between the trench bottoms and the substrate 302 is in a range of 1 micron to 2 microns thick. In another embodiment, the bottom of the trenches may extend to the substrate 302. Each of the pillars 722 and trenches 724 has a width in a range of 1.1 microns to 5.0 microns. The illustrations in FIGS. 7 and 8 correspond to the suppression-side structure. The pillars of the contact-side structure can be narrower, substantially the same as, or wider than the pillars 722, and the trenches of the contact-side structure can be narrower, substantially the same as, or wider than the trenches 724. In a particular embodiment, the pillars of the contact-side structures are narrower than the pillars 722 and may be as narrow as 0.5 micron, and the trenches of the contact-side structures are substantially the same at the trenches 724. The pillars for the contact-side structures would have the same composition as the pillars 722 except that the doped regions 524 are not present.

Charge compensation regions 846 are formed along sidewalls of the pillars 722. In an embodiment, the charge compensation regions 846 are formed using ion implant. In one embodiment, boron ($B^+$) ions are implanted to a total dose in a range of $1.0 \times 10^{13}$ ions/cm$^2$ to $4.0 \times 10^{13}$ ions/cm$^2$ at an energy in a range of 25 to 40 keV with a 7° to 10° tilt angle. In a particular embodiment, the total dose can be introduced as four implants at ¼ of the total dose with a 90° rotation of the substrate 302 between the implants. The effective implant and depth may be reduced when a screen oxide layer is present. Because of the small angle between the ion implant and the trench sidewall, the ion implant along the sidewall would be equivalent to an ion implant perpendicular to the surface with an effective dose in the pillars 722 along the sidewalls of the pillars 722 in a range of $3.0 \times 10^{12}$ ions/cm$^2$ to $7.0 \times 10^{12}$ ions/cm$^2$. In subsequent thermal diffusion steps, the dopant will diffuse to create the charge compensation regions, and, in a particular embodiment, extend throughout the widths of the pillars 722 between adjacent trenches 724 and above the doped regions 524.

Sidewalls spacers (not illustrated) can be formed in the trenches 724 to protect sidewalls of the pillars 722 and expose portions of the semiconductor layer 322 at the bottoms of the trenches 724. If needed or desired, some of the semiconductor layer 322 along the bottoms of trenches 724 may be etched to remove dopant from the charge compensation implant. In an embodiment, no more than 0.4 micron of the semiconductor layer 322 is removed.

In another embodiment, the charge compensation regions can be formed from a deposited doped semiconductor layer. The semiconductor layer can be formed by epitaxially growing a p-type semiconductor layer along sidewalls of the pillars 722. The semiconductor layer may or may not include a thin buffer layer of intrinsic semiconductor material. Portions of the semiconductor layer are etched to remove the semiconductor layer along an uppermost surface of the workpiece and along the bottoms of the trenches 724. As before, dopant in the remaining portions of the p-type semiconductor layer can be diffused into the pillars 722.

The bottoms of the trenches 724 can be doped to allow a lower resistance conduction path to the substrate 302. In an embodiment, the doped regions 824 are formed within the semiconductor layer 322 adjacent to the bottoms of the trenches 724. The doped regions 824 have the same conductivity type as the doped region 324 and the substrate 302. The peak dopant concentration within the doped regions 824 can be greater than $2 \times 10^{17}$ atoms/cm$^3$. An anneal can be performed to drive the dopants to achieve the doped regions and other features as illustrated in FIGS. 7 and 8. The contact-side structures will have the same construction and be formed using the same process sequence except that the doped regions 524 are not present.

Figure 9:
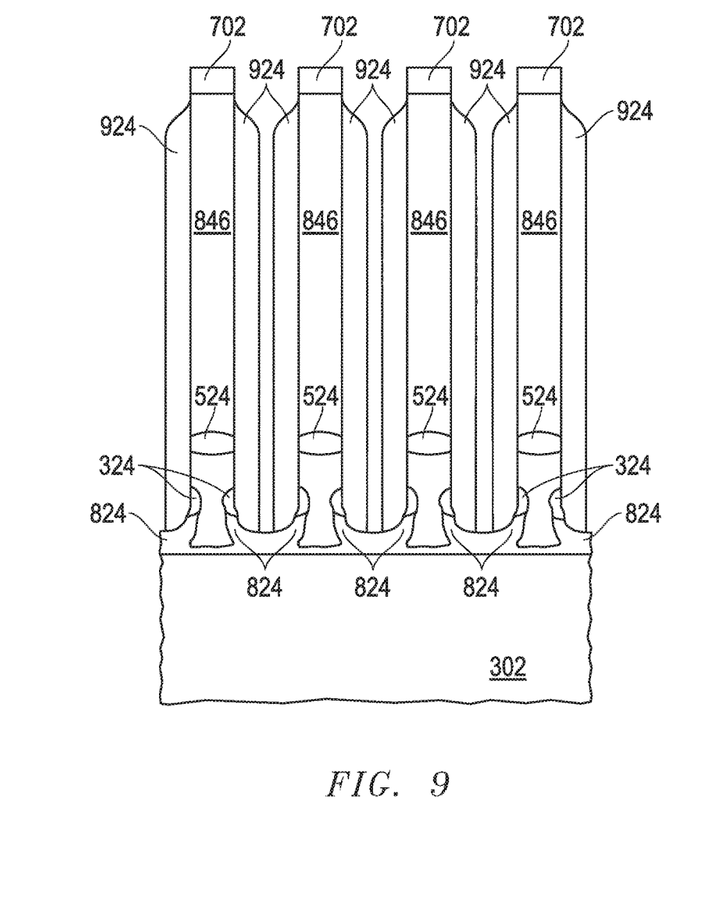
FIGS. 9 and 10 include illustrations of cross-sectional views of the workpiece of FIGS. 7 and 8 after forming a doped semiconductor layer within the trenches.
Figure 10:
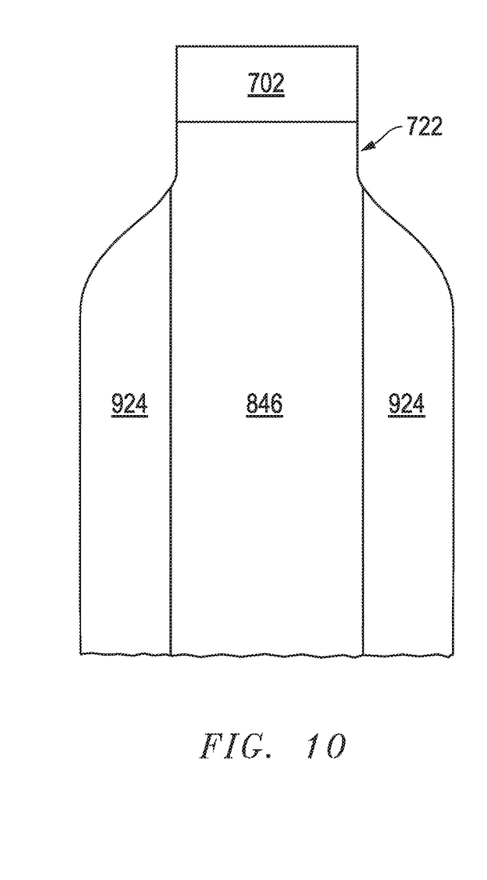

FIGS. 9 and 10 include cross-sectional views of the full height of the structure and an enlarged view near the top of the structure after forming a doped semiconductor layer 924 that can be a charge compensation layer for the structure. In an embodiment, the doped semiconductor layer 924 can be epitaxially grown from exposed portions of the semiconductor material along sidewalls of the pillars 722 and within the trenches 724. If a non-selective epitaxy process is used, the portion of the doped semiconductor layer 924 formed over the hard mask layer 702 will be polycrystalline. If a selective epitaxy process is used, there will be substantially no semiconductor layer formed over the hard mask layer 702. In an embodiment, the doped semiconductor layer 924 has a thickness in a range of 0.5 microns to 1.2 microns. In a particular embodiment, the doped semiconductor layer 924 includes a buffer film of 40 nm to 120 nm of intrinsic semiconductor material adjacent to the charge compensation regions 846, an intermediate film of 200 nm to 600 nm of n-type semiconductor having a dopant concentration in a range of $2 \times 10^{16}$ to $5 \times 10^{16}$ atoms/cm$^3$, and an inner film of 200 nm to 600 nm of intrinsic semiconductor material. The buffer film helps to reduce mutual counter-doping between the charge compensation region 846 and the intermediate film of the doped semiconductor layer 924. The intermediate film is as thick as reasonable possible to provide high electron mobility within the trenches 724.

An anisotropic etch is performed to remove portions of the doped semiconductor layer 924 overlying the hard mask layer 702 and along the bottoms of the trenches 724. The etch can be extended to recess the doped semiconductor layer 924 such that the highest elevation of the doped semiconductor layer 924 is 400 nm to 800 nm below an elevation of the tops of the pillars 722 (excluding the hard mask layer 702 that overlies the pillars 722). The recess etch forms the shoulder of the doped semiconductor layer 924. Subsequently-formed gate electrodes for the power transistor will be formed adjacent to the recesses. The hard mask layer 702 can be removed at this point in the process.

In a finished device, charge compensation regions 846 are p-type and electrically connected to a subsequently-formed source electrode for the power transistor adjacent to the top surface of the pillars 722, and the doped semiconductor layer 924 is n-type and coupled to the substrate 302. Thus, the doped semiconductor layer 924 is the drift region for the power transistor, and the substrate 302 will be electrically connected to a drain terminal for the power transistor.

Figure 11:
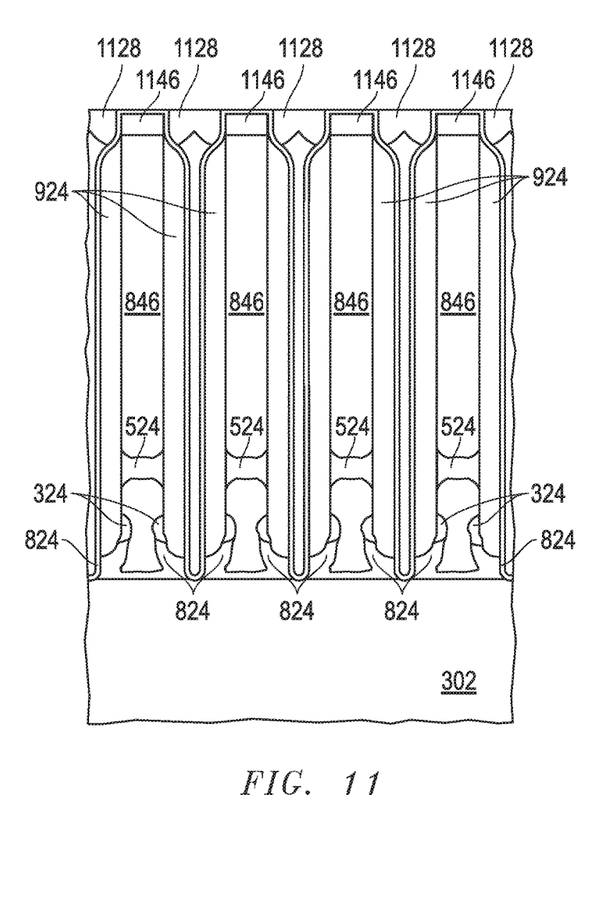
FIGS. 11 and 12 include illustrations of cross-sectional views of the workpiece of FIGS. 9 and 10 after forming a gate dielectric layer, filling the trenches, and forming gate electrodes and body regions.
Figure 12:
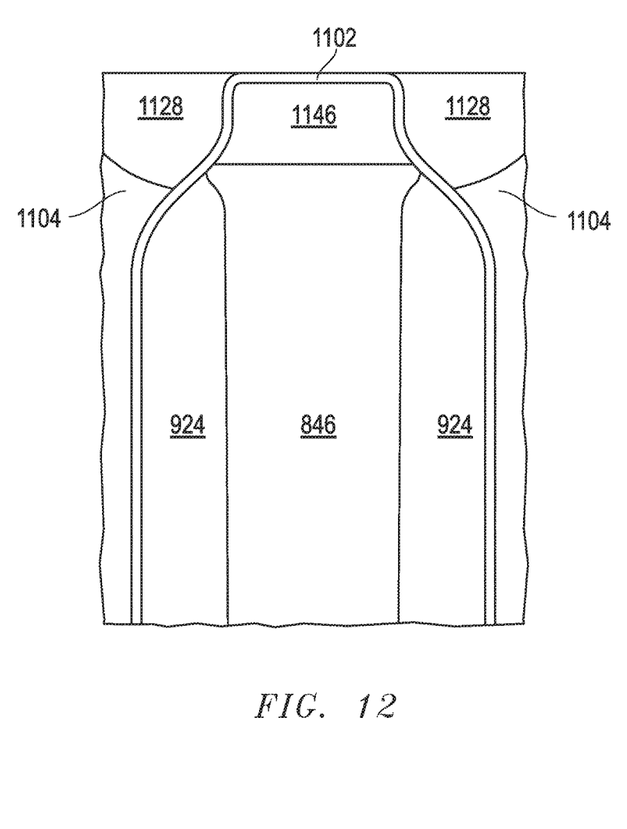

FIGS. 11 and 12 include cross-sectional views of the full height of the structure and an enlarged view near the top of the structure after forming a gate dielectric layer 1102, a trench fill material 1104, gate electrodes 1128, and body regions 1146. The gate dielectric layer 1102 can be formed within the trenches 724 and over the pillars 722 (not labeled in FIGS. 11 and 12). The gate dielectric layer 1102 can have a thickness in a range of 30 nm to 150 nm. If needed or desired, a nitride film can be formed to protect the gate dielectric layer 1102 during subsequent processing. If the gate dielectric layer 1102 is formed at a later point in the process, the nitride film may not be formed. A trench fill material 1104 is deposited over the gate dielectric layer 1102. In an embodiment, the trench fill material 1104 can completely fill the trenches 724 or be deposited to seal off the trenches 724 and form voids within the trenches 724. In an embodiment, the trench fill material 1104 can be an insulator and include an oxide, a nitride, an oxynitride, and may include a single film or a plurality of films.

In an embodiment, the trench fill material 1104 does not completely fill the trenches 724 and leaves recessions along the surface. The recessions can be filled with a semiconductor material or insulating material. A layer of sufficient thickness is deposited along the exposed surface of the workpiece and fills in the recessions. Further processing of such layer can depend on the material of the layer and whether islands of the layer are to remain within the trenches 724. In an embodiment, the layer includes a semiconductor material and semiconductor islands are formed. A planarization operation is performed to remove the layer except within the recessions. An etch is performed to recess portions of the layer within the recessions to form the semiconductor islands. In another embodiment, the layer includes an insulating material. In a particular embodiment, a planarization operation is performed to remove portions of the layer and any trench fill material that overlies the pillars 722. In this embodiment, no semiconductor islands are formed.

An isotropic etch is performed to remove any remaining portion of the trench fill material 1104 outside the trenches 724 and to remove portions of the trench fill material 1104 within the trenches 724. When the trench fill material 1104 includes an oxide, and a nitride film overlies the gate dielectric layer 1102, the isotropic etch can be performed with an oxide etchant that stops on the nitride film. In an embodiment in which semiconductor islands are formed, the isotropic etch may be performed so that etch does not completely undercut the semiconductor islands. The semiconductor islands may or may not be removed at this point in the process. In an embodiment where semiconductor islands are not formed, undercut concerns are obviated.

The gate electrodes 1128 can be formed at this point in the process. If the semiconductor islands are present, the semiconductor islands can be part of the gate electrodes 1128. A heavily doped semiconductor layer can be formed over exposed portions of the workpiece, and portions of the heavily doped semiconductor layer can be removed by an etch-back process or planarization to form the gate electrodes 1128.

The body regions 1146 can be formed within the pillars 722 near the upper surface of the pillars 722. The body regions 1146 can be used to control the threshold voltage of the power transistor structures. The body regions 1146 have a conductivity type opposite that of the substrate 302. Dopant for the body regions 1146 can be implanted using a single implant or a sequence of different implants at different energies. The body regions 1146 can include a p-type dopant and have a maximum doping concentration in a range of $5 \times 10^{15}$ to $5 \times 10^{16}$ atoms/cm$^3$, and a depth in a range of 0.3 micron to 1.2 microns. The actual concentration and depth may depend on the device design, nominal operating voltage, threshold voltage, drain-to-source breakdown voltage, or the like.

Figure 13:
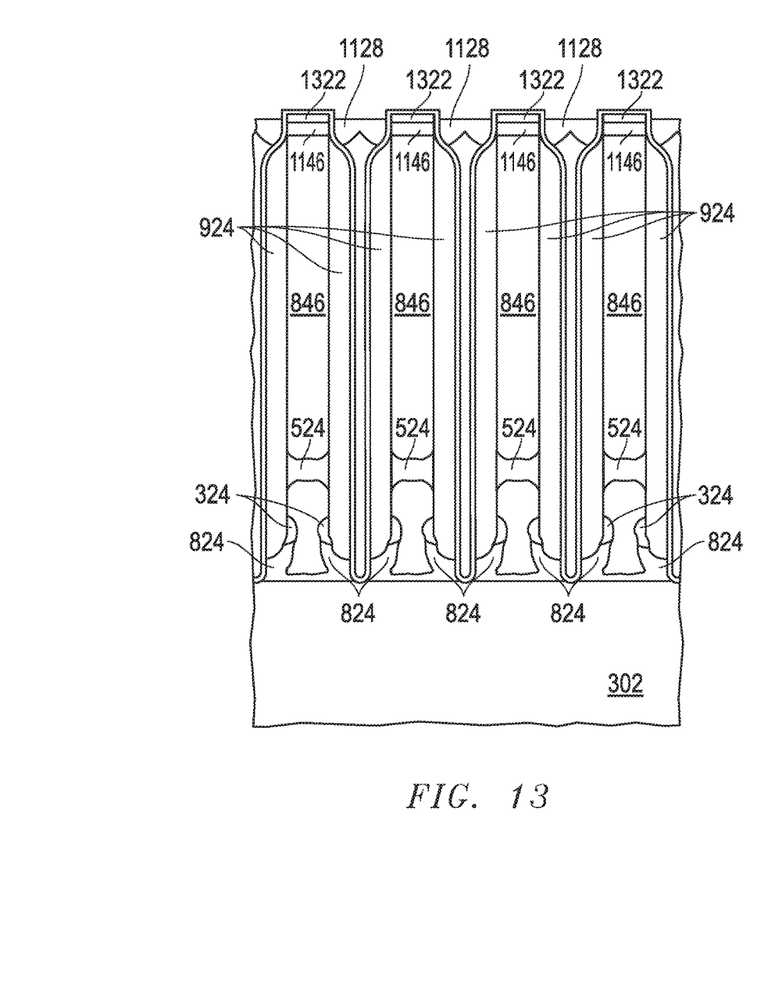
FIGS. 13 and 14 include illustrations of cross-sectional views of the workpiece of FIGS. 11 and 12 after forming source regions and recessing the gate electrodes.
Figure 14:
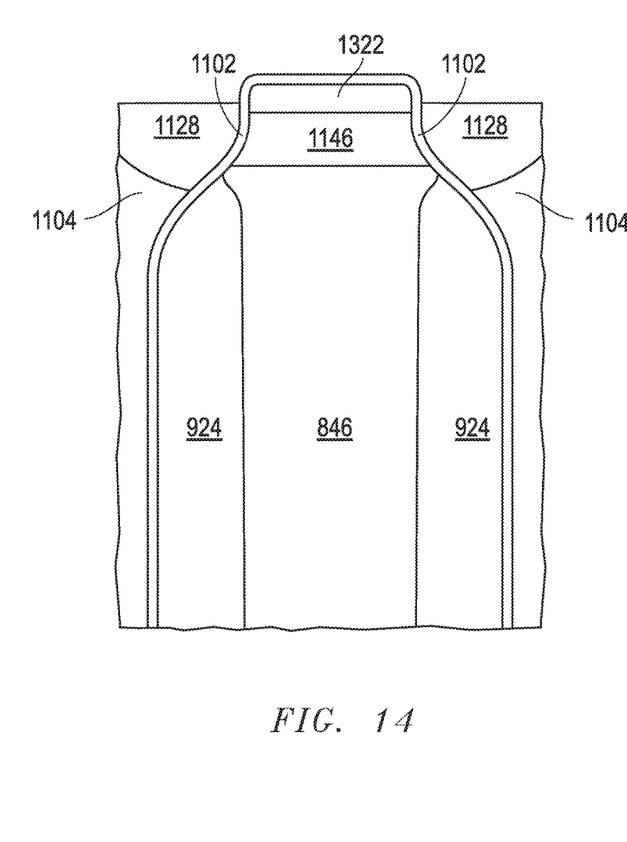

Source regions 1322 are formed, as illustrated in FIGS. 13 and 14. The source regions 1322 have the same conductivity type as the substrate 302. In an embodiment, the source regions 1322 can include an n-type dopant and have a dopant concentration greater than $1 \times 10^{19}$ atoms/cm$^3$. The gate electrodes 1128 can be partly recessed to reduce source-to-gate capacitance, if needed or desired.

Supplemental information and other alternatives regarding the trench fill, gate electrode, body region, and source region formation are disclosed in U.S. Pat. No. 9,620,585, which is incorporated by reference with respect to structures within the active region and their formation.

Figure 15:
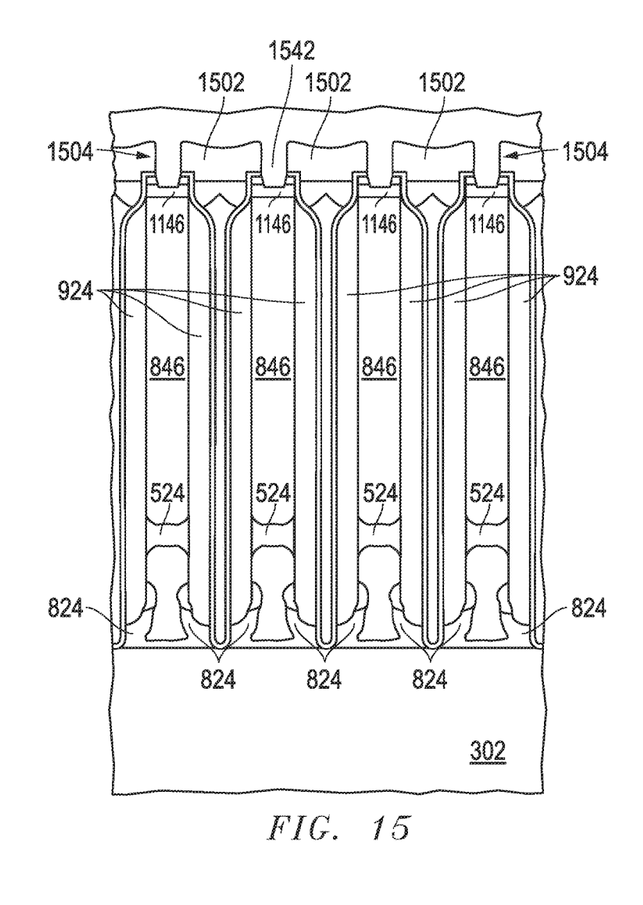
FIGS. 15 and 16 include illustrations of cross-sectional views of the workpiece of FIGS. 13 and 14 after forming a substantially completed physical structure.
Figure 16:
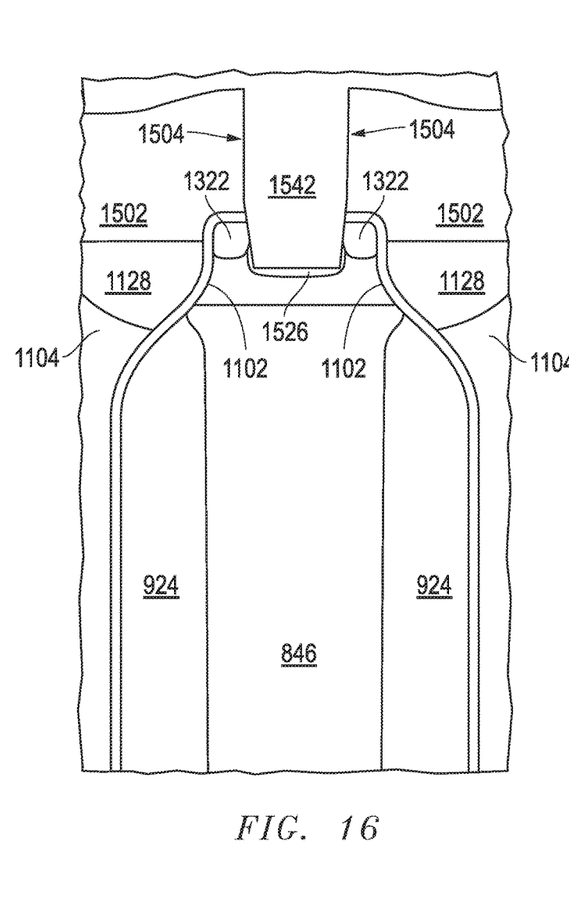

FIGS. 15 and 16 illustrate a substantially completed physical structure that corresponds to the circuit illustrated in FIGS. 1 and 2. An interlevel dielectric (ILD) layer 1502 is formed and patterned to define contact openings 1504. The ILD layer 1502 can include one or more films of oxide, nitride, or oxynitride, and such films may be doped or undoped. The ILD layer 1502 can be formed by chemical or vapor phase deposition. A mask is formed over the ILD layer 1502 and defines openings that expose portions of the ILD layer 1502 where the contact openings 1504 are formed. An etch is performed to etch through the ILD layer 1502, the source regions 1322, and the body regions 1146. Body contact regions 1526 can be formed along the bottoms of the contact openings 1504. The body contact regions 1526 are heavily doped and kept as shallow as reasonably possible. The mask is removed.

A metal layer is deposited and patterned to from a source electrode 1542, and a gate terminal (not illustrated) electrically connected to the gate electrodes 1128. The metal layer may include one or more films that can include an adhesion film, a barrier film, and a bulk film that makes up most of the metal layer.

A passivation layer (not illustrated) is formed over the ILD layer 1502, the source electrode 1542, and the gate terminal. The passivation can include one or more films of a insulating material. In a particular embodiment, the passivation layer include polyimide that is coated and pattern to expose portions of the source electrode 1542 and the gate terminal. The reverse side of the semiconductor die may then be provided with a drain electrode that contacts the substrate 302.

The semiconductor die with the structures seen in the figures can be put into a package, and the packaged die may be mounted on a circuit or printed wiring board. Thus, the electronic device can be the semiconductor die, the packaged die, the circuit or printed wiring board, at a higher level within an apparatus, or the like The embodiments described above address n-channel FET structures. For p-channel FET structures, opposite dopant types can be used. In embodiments described above, the semiconductor material can be silicon. In other embodiment, other semiconductor materials, such as silicon carbide, germanium, Group 13-Group 15, or other materials capable of forming a rectifying junction can be used. The actual dopants used may depend on the principal compound making up the semiconductor material.

Figure 17:
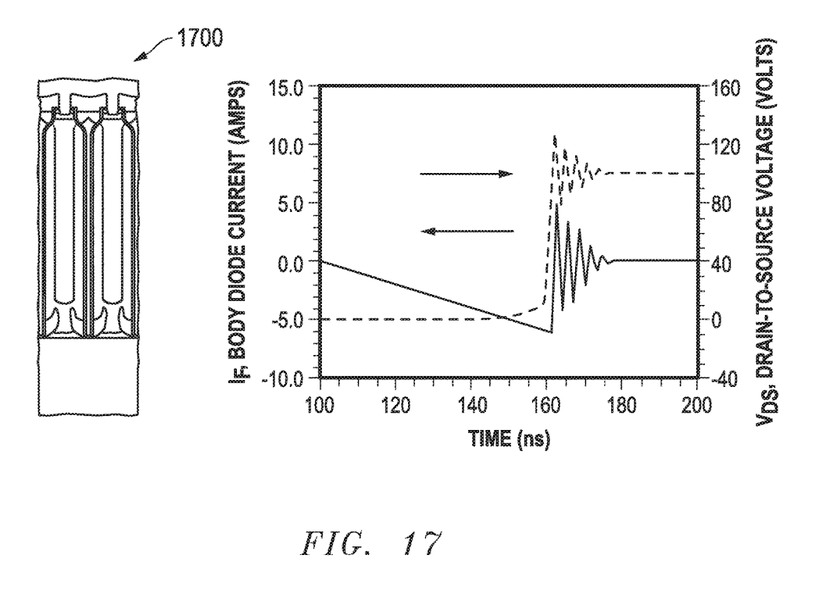
FIG. 17 includes an illustration of a cross-sectional view of a portion of a comparative example of power transistor without a ring suppression structure and a plot of simulated voltage and current as a function of time during a switching operation.
Figure 18:
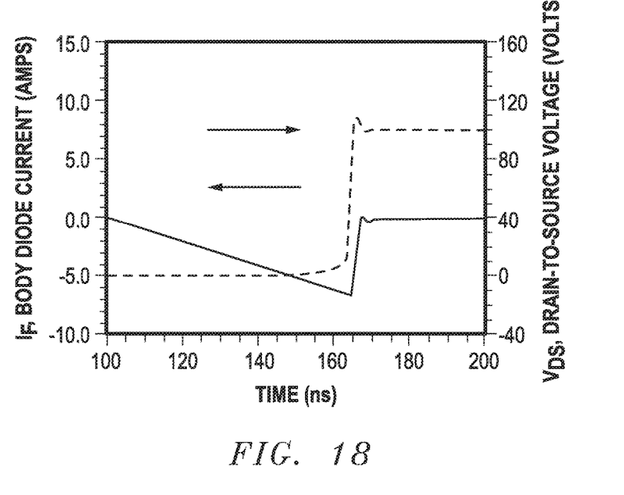
FIG. 18 includes an illustration of a plot of simulated voltage and current as a function of time during a switching operation for the suppression-side structure as described and illustrated in FIGS. 15 and 16.

Embodiments as described herein can reduce the amount of ringing when the power transistor is switched off. FIG. 17 includes an illustration of a comparison device 1700 that includes a power transistor without a ring suppression structure. FIG. 17 further includes a simulation of voltage and current as a function of time during the reverse recovery of the body diode of the power transistor. In the simulations, the forward bias body current was 10 A, and the reverse bias voltage was 100 V with a current ramp rate of 100 A per microsecond. The reverse recovery begins at 100 nanoseconds when the forward current is zero and ends when the current returns to zero by about 170 nanoseconds. The peak reverse current occurs just after 160 nanoseconds. FIG. 18 includes a simulation of voltage and current as a function of time for a new power transistor that includes transistors structures as described and illustrated with respect to FIGS. 1 to 16. The simulation conditions were the same as previously described with respect to FIG. 17. There is less voltage and current ringing in the device with the ring suppression structure. Also, the magnitude of the voltage and current overshoot/undershoot is greatly reduced. Although the gate of the power transistor was not activated during the body diode reverse recovery simulations, similar results are obtained for switching events when the power transistor gate is activated, such as occur in hard switching power conversion topologies.

Many different aspects and embodiments are possible. Some of those aspects and embodiments are described below. After reading this specification, skilled artisans will appreciate that those aspects and embodiments are only illustrative and do not limit the scope of the present invention. Embodiments may be in accordance with any one or more of the embodiments as listed below.

Embodiment 1

A circuit including:
a first field-effect transistor having a body and a drain; and
a bipolar transistor having a base and a collector,
wherein:
  the collector of the bipolar transistor is coupled to the body of the first field-effect transistor; and
  the drain of the first field-effect transistor is coupled to the base of the bipolar transistor.

Embodiment 2

The circuit of Embodiment 1, further including a first power supply terminal coupled to the drain of the first field-effect transistor; and a second power supply terminal coupled to a source of the first field-effect transistor.

Embodiment 3

The circuit of Embodiment 2, further including a second field-effect transistor having a gate, wherein the gate of the second field-effect transistor and the base of the bipolar transistor are coupled to the first power supply terminal.

Embodiment 4

The circuit of Embodiment 3, further including a first charge storage element having a first electrode coupled to the first power supply terminal, and a second electrode coupled to a source of the second field-effect transistor.

Embodiment 5

The circuit of Embodiment 4, wherein the first charge storage element is a first diode having an anode and a cathode, wherein the cathode is coupled to the first power supply terminal, and the anode is coupled to the source of the second field-effect transistor.

Embodiment 6

The circuit of Embodiment 5, further including a third field-effect transistor having a source and a drain, wherein the drain is coupled to the second power supply terminal; and a second charge storage element having a first terminal coupled to the first power supply terminal, and a second terminal coupled to the source of the third field effect transistor.

Embodiment 7

The circuit of Embodiment 6, further including a first resistor having a first terminal coupled to the source of the second field-effect transistor, and a second terminal coupled to the source of the third field-effect transistor.

Embodiment 8

The circuit of Embodiment 6, further including a first resistor and a second resistor, wherein:
  a first terminal of the first resistor is electrically connected to the collector of the bipolar transistor, and the second terminal of the first resistor is electrically connected to a source of the first field-effect transistor; and
  a first terminal of the second resistor is electrically connected to the drain of the third field-effect transistor, and the second terminal of the second resistor is electrically connected to the source of the first field-effect transistor.

Embodiment 9

The circuit of Embodiment 6, wherein:
  the first field-effect transistor is an enhancement-mode power, n-channel insulated gate field-effect transistor;
  the bipolar transistor is a PNP transistor;
  each of the second and third transistors is a depletion-mode p-channel junction field-effect transistor;
  the first charge storage element is a first pn junction diode having an anode and a cathode;
  the second charge storage element is a second pn junction diode having an anode and a cathode;
  an emitter of the bipolar transistor is electrically connected to a drain of the second field-effect transistor;
  the base of the bipolar transistor, the gate of the second field-effect transistor, a gate of the third field-effect transistor, and the cathodes of the first and second pn junction diodes are electrically connected to one another;
  the source of the second field-effect transistor is electrically connected to the anode of the first pn junction diode; and
  the source of the third field-effect transistor is electrically connected to the anode of the second pn junction diode.

Embodiment 10

A circuit including a first diode having an anode and a cathode; and a first field-effect transistor having a source and a gate, wherein the source is coupled to the anode of the first diode, and the gate is coupled to the cathode of the first diode.

Embodiment 11

The circuit of Embodiment 10, further including a first circuit terminal, a second circuit terminal, and a resistor having a first terminal and a second terminal, wherein the cathode of the first diode is coupled to the first circuit terminal, the first terminal of the resistor is coupled to a drain of the first field-effect transistor, and the second terminal of the resistor is coupled to the second circuit terminal.

Embodiment 12

The circuit of Embodiment 10, further including:
  a second diode having an anode and a cathode;
  a second field-effect transistor having a source, a gate, and a drain; and
  a bipolar transistor having an emitter, a base, and a collector,
  wherein:
    the cathodes of the first and second diodes, the gates of the first and second field-effect transistors, and the base of the bipolar transistor are electrically connected to one another; and
    the emitter of the bipolar transistor is electrically connected to the source of the second field-effect transistor.

Embodiment 13

An electronic device including:
a substrate including a semiconductor material;
a first trench;
a second trench spaced apart from the first trench; and
a ring suppression structure disposed between the first and second trenches and including:
  a first doped region overlying the substrate and having a first conductivity type;
  a second doped region overlying the first doped region and having a second conductivity type opposite that of the first conductivity type; and
  a third doped region overlying the second doped region and having the first conductivity type.

Embodiment 14

The electronic device of Embodiment 13, further including a gate electrode of a field-effect transistor structure adjacent to the first doped region.

Embodiment 15

The electronic device of Embodiment 14, wherein the gate electrode is closer to:
a bottom of the first trench than to a top of the first trench;
a bottom of the second trench than to a top of the second trench; or
the bottoms of the first and second trenches than to the tops of the first and second trenches.

Embodiment 16

The electronic device of Embodiment 13, wherein:
the first doped region includes a first portion, a second portion, and a third portion;
the second portion of the first doped region is disposed between and narrower than each of the first and third portions of the first doped region; and
the second doped region is closer to the third portion of the first doped region than to each of the first and second portions of the first doped region.

Embodiment 17

The electronic device of Embodiment 16, wherein the second portion of the first doped region includes a pinch-off region of a field-effect transistor structure.

Embodiment 18

The electronic device of Embodiment 17, further including a gate electrode of the field-effect transistor structure adjacent to the second portion of the first doped region.

Embodiment 19

The electronic device of Embodiment 13, wherein the second doped region is a base region of a bipolar transistor structure.

Embodiment 20

The electronic device of Embodiment 13, further including an active field-effect transistor structure, wherein the active field-effect transistor structure and the ring suppression structure are disposed between the first and second trenches.

Embodiment 21

An electronic device including:
a first structure including:
  a first doped region having a first conductivity type;
  a second doped region overlying the first doped region and having a second conductivity type opposite the first conductivity type; and
  a third doped region overlying the second doped region and having the first conductivity type; and
a second structure including a fourth doped region having the first conductivity type and coupled to the first doped region of the first structure.

Embodiment 22

The electronic device of Embodiment 21, wherein the second doped region abuts each of the first and third doped regions, is a base region of a bipolar transistor structure, and is coupled to a power supply terminal.

Embodiment 23

The electronic device of Embodiment 21, wherein the third and fourth doped regions are coupled to a power supply terminal.

Embodiment 24

The electronic device of Embodiment 21, wherein the first structure is a ring suppression structure, and the second structure is a contact structure coupled to the first doped region.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. An electronic device comprising:
   a substrate including a semiconductor material;
   a first trench;
   a second trench spaced apart from the first trench; and
   a ring suppression structure disposed between the first and second trenches and including a bipolar transistor structure that includes:
      a first doped region overlying the substrate and having a first conductivity type;
      a second doped region overlying the first doped region and having a second conductivity type opposite that of the first conductivity type; and
      a third doped region overlying the second doped region and having the first conductivity type.

2. The electronic device of claim 1, further comprising a gate electrode of a junction field-effect transistor structure adjacent to the first doped region.

3. The electronic device of claim 2, wherein the gate electrode is closer to:
   a bottom of the first trench than to a top of the first trench;
   a bottom of the second trench than to a top of the second trench; or
   the bottoms of the first and second trenches than to the tops of the first and second trenches.

4. The electronic device of claim 1, wherein:
   the first doped region includes a first portion, a second portion, and a third portion;
   the second portion of the first doped region is disposed between and narrower than each of the first and third portions of the first doped region; and
   the second doped region is closer to the third portion of the first doped region than to each of the first and second portions of the first doped region.

5. The electronic device of claim 4, wherein the second portion of the first doped region includes a pinch-off region of a junction field-effect transistor structure.

6. The electronic device of claim 5, further comprising a gate electrode of the junction field-effect transistor structure adjacent to the second portion of the first doped region.

7. The electronic device of claim 1, wherein the second doped region is a base region of the bipolar transistor structure.

8. The electronic device of claim 1, further comprising an active field-effect transistor structure, wherein the active field-effect transistor structure and the ring suppression structure are disposed between the first and second trenches.

9. The electronic device of claim 7, wherein the third doped region includes a collector region of the bipolar transistor structure.

10. The electronic device of claim 9, wherein the first doped region includes an emitter region of the bipolar transistor structure.

11. An electronic device comprising:
    a ring suppression structure including:
       a first portion of a first doped region having a first conductivity type;
       a second doped region overlying the first doped region and having a second conductivity type opposite the first conductivity type; and
       a first portion of a third doped region overlying the second doped region and having the first conductivity type; and
    a contact structure including:
       a second portion of the first doped region; and
       a second portion of the third doped region,
       wherein the contact structure has a different composition as compared to the ring suppression structure.

12. The electronic device of claim 11, wherein the second doped region abuts each of the first and third doped regions, is a base region of a bipolar transistor structure, and is coupled to a power supply terminal.

13. The electronic device of claim 11, further comprising a fourth doped region underlying the first and second portions of the first doped region and having the second conductivity type, wherein the fourth doped regions is coupled to a power supply terminal.

14. The electronic device of claim 13, wherein:
    the first portion of the first doped region includes a drain region of a first junction field-effect transistor and an anode of a first charge storage element; and
    the second portion of the first doped region includes a drain region of a second junction field-effect transistor and an anode of a second charge storage element; and
    the fourth doped region includes cathodes of the first and second charge storage elements.

15. The electronic device of claim 11, wherein the ring suppression structure and the contact structure are disposed within a same pillar.

16. The electronic device of claim 15, wherein from a top view, the contact structure is narrower than the ring suppression structure.

17. The electronic device of claim 15, wherein each of the ring suppression and contact structures includes a doped semiconductor layer along a sidewall of the pillar.

18. The electronic device of claim 17, wherein a portion of the doped semiconductor layer includes a drift region of an insulated gate field-effect transistor.

19. The electronic device of claim 11, wherein the contact structure does not include any portion of the second doped region.

* * * * *